(12) United States Patent
Madala et al.

(10) Patent No.: US 10,951,226 B2
(45) Date of Patent: Mar. 16, 2021

(54) RADIO-FREQUENCY DIGITAL-TO-ANALOG CONVERTER SYSTEM

(71) Applicant: TEXAS INSTRUMENTS INCORPORATED, Dallas, TX (US)

(72) Inventors: Srinivasa Rao Madala, Bengaluru (IN); Rahul Sharma, Bengaluru (IN); Sandeep Kesrimal Oswal, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/555,160

(22) Filed: Aug. 29, 2019

(65) Prior Publication Data

US 2020/0212928 A1 Jul. 2, 2020

Related U.S. Application Data

(63) Continuation of application No. 16/233,207, filed on Dec. 27, 2018, now Pat. No. 10,439,631.

(51) Int. Cl.
| | |
|---|---|
| *H03M 1/66* | (2006.01) |
| *H03M 1/76* | (2006.01) |
| *H03M 1/06* | (2006.01) |
| *H04B 1/04* | (2006.01) |
| *H03M 1/54* | (2006.01) |

(Continued)

(52) U.S. Cl.
CPC ............. *H03M 1/76* (2013.01); *H03M 1/068* (2013.01); *H03M 1/127* (2013.01); *H03M 1/54* (2013.01); *H04B 1/0475* (2013.01); *H04L 25/03343* (2013.01)

(58) Field of Classification Search
CPC ........ H03M 1/365; H03M 1/468; H03M 5/04; H03M 1/1061; H03M 1/12; H03M 1/804; H03M 1/0658; H03M 1/0695; H03M 1/1215; H03M 1/127; H03M 1/46; H03M 3/336; H03M 3/43; H03M 1/00; H04L 27/2637; H04L 25/4902; H04L 27/0004;
(Continued)

(56) References Cited

U.S. PATENT DOCUMENTS

| | | |
|---|---|---|
| 7,528,754 B1 | 5/2009 | Bakkaloglu et al. |
| 9,385,742 B1 | 7/2016 | Cheng et al. |

(Continued)

OTHER PUBLICATIONS

Erik Olieman, et al. "An Interleaved Full Nyquist High-Speed DAC Technique." IEEE Journal of Solid-State Circuits, vol. 50, No. 3, Mar. 2015. pp. 404-713.

*Primary Examiner* — Linh V Nguyen
(74) *Attorney, Agent, or Firm* — John R. Pessetto; Charles A. Brill; Frank D. Cimino (57) ABSTRACT

A digital-to-analog converter system has digital-to-analog converters, a common output, and a digital controller for transmitting first codes to one of the converters at a radio-frequency digital rate, and for transmitting second codes to another one of the converters at the same rate. The digital controller includes a timing system for operating each converter at the digital rate in a return-to-zero configuration, such that a signal from the first converter is transmitted to the common output while the second converter is reset, and vice versa. The digital-to-analog converter system can generate a radio-frequency analog signal having signals in first and second Nyquist zones simultaneously.

7 Claims, 4 Drawing Sheets

(51) Int. Cl.
*H04L 25/03* (2006.01)
*H03M 1/12* (2006.01)

(58) Field of Classification Search
CPC . H04L 27/0008; H04L 27/2017; H04L 27/34; H04L 7/0008
USPC ......... 314/134–136, 144, 145; 375/295, 241, 375/240, 296, 300
See application file for complete search history.

(56) References Cited

U.S. PATENT DOCUMENTS

| | | | | |
|---|---|---|---|---|
| 9,413,383 | B1* | 8/2016 | Sharma | H03M 3/384 |
| 9,413,394 | B1* | 8/2016 | Lye | H03F 1/02 |
| 10,439,631 | B1* | 10/2019 | Madala | H03M 1/662 |
| 2002/0140593 | A1* | 10/2002 | Eshraghi | H03M 3/372 |
| | | | | 341/144 |
| 2003/0012307 | A1* | 1/2003 | Martin | H04L 27/2332 |
| | | | | 375/324 |
| 2004/0196923 | A1* | 10/2004 | Feher | H04L 27/362 |
| | | | | 375/299 |
| 2007/0018867 | A1 | 1/2007 | Uemori et al. | |
| 2010/0001701 | A1 | 1/2010 | Cygan et al. | |
| 2010/0098191 | A1* | 4/2010 | Morris | H03D 7/161 |
| | | | | 375/322 |
| 2011/0075780 | A1* | 3/2011 | Petrovic | H03M 1/0614 |
| | | | | 375/355 |
| 2011/0085573 | A1 | 4/2011 | Bartels et al. | |
| 2012/0147943 | A1 | 6/2012 | Goodman et al. | |
| 2014/0015701 | A1 | 1/2014 | Wang et al. | |
| 2014/0159933 | A1* | 6/2014 | Dufrene | H03M 1/66 |
| | | | | 341/144 |
| 2015/0048960 | A1* | 2/2015 | Zhu | H03M 1/0863 |
| | | | | 341/144 |
| 2015/0048961 | A1 | 2/2015 | Schafferer et al. | |
| 2015/0341042 | A1* | 11/2015 | Balachandran | H03L 7/093 |
| | | | | 327/156 |
| 2016/0020781 | A1* | 1/2016 | Baringer | H03M 3/46 |
| | | | | 341/110 |
| 2016/0094235 | A1* | 3/2016 | Kuttner | H03M 1/662 |
| | | | | 341/144 |
| 2016/0118996 | A1* | 4/2016 | Chen | H03M 1/66 |
| | | | | 341/118 |
| 2016/0182076 | A1* | 6/2016 | El-Chammas | H03M 1/1009 |
| | | | | 341/121 |
| 2016/0191033 | A1* | 6/2016 | Lee | H03M 1/0863 |
| | | | | 341/118 |
| 2018/0241412 | A1* | 8/2018 | Schafferer | H03M 1/74 |
| 2019/0383924 | A1* | 12/2019 | Mehdizad Taleie | H04L 27/364 |

\* cited by examiner

FIG. 7

RADIO-FREQUENCY DIGITAL-TO-ANALOG CONVERTER SYSTEM

CROSS REFERENCE TO RELATED APPLICATION(S)

This continuation application claims priority to U.S. patent application Ser. No. 16/233,207, filed Dec. 27, 2018, which application is hereby incorporated herein by reference in its entirety.

BACKGROUND

A digital-to-analog (D/A) converter (DAC) system is used to generate an analog signal based on a series of digital codes. A radio-frequency (RF) digital-to-analog converter system may be utilized in a variety of applications, including in a telecommunication system. A digital-to-analog converter system may also be used, if desired, in connection with a multi-step analog-to-digital (A/D) converter (ADC) system, a high-resolution display system, a waveform synthesis system, and an instrumentation device.

SUMMARY

This disclosure relates to a digital-to-analog converter system which has first and second digital-to-analog converters, a common output coupled to the digital-to-analog converters, and a digital controller coupled to the digital-to-analog converters for transmitting first codes to the first digital-to-analog converter at a radio-frequency digital rate, and for transmitting second codes to the second digital-to-analog converter at the same digital rate. According to this aspect of the disclosure, the digital controller includes a timing system for operating each digital-to-analog converter at the digital rate in a return-to-zero configuration, such that a signal from the first digital-to-analog converter is transmitted to the common output while the second converter is reset, and a signal from the second digital-to-analog converter is transmitted to the common output while the first digital-to-analog converter is reset.

This disclosure also relates to a method which includes: generating first codes based on incoming codes, wherein the first codes are equal to the sum of first and second components of the incoming codes; generating second codes based on the incoming codes, by subtracting the second component of the incoming codes from the first component of the incoming codes; causing the second codes to be delayed relative to the first codes; inputting the first and second codes to first and second digital-to-analog converters, respectively; and causing the first and second digital-to-analog converters to generate a radio-frequency analog signal having signals in first and second Nyquist zones simultaneously.

DETAILED DESCRIPTION

Figure 1:
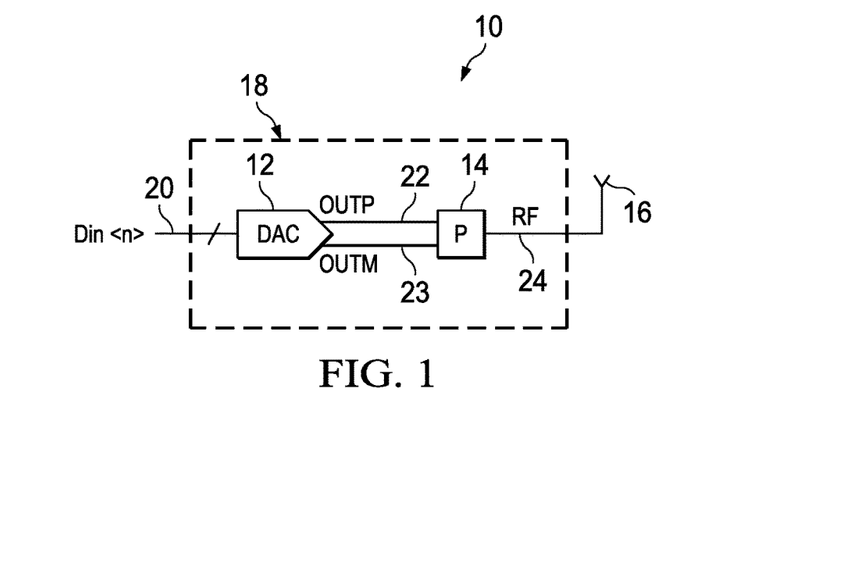
FIG. 1 is a block diagram of a radio-frequency conversion and transmission system constructed in accordance with one example of this disclosure.

Referring now to the drawings, where like reference numerals designate like elements and steps, there is shown in FIG. 1 a radio-frequency conversion and transmission system 10 which includes a digital-to-analog converter system 12 and a suitable signal-processing circuit 14. The digital-to-analog converter system 12 receives and converts a sequence of digital codes Din<n> into complementary analog output signals OUTP (output plus), OUTM (output minus). The processing circuit 14 processes the analog output signals OUTP, OUTM, and outputs a corresponding, processed, radio-frequency signal RF to a transmitter 16. In the illustrated example, the processing circuit 14 includes, among other things, a reconstruction filter (not shown).

In the illustrated example, the digital-to-analog converter system 12 and the processing circuit 14 are connected to or integrated into an integrated circuit (IC) and/or a chip 18 fabricated according to various semiconductor and/or other processes. One or more conductive lines 20, 22, 23, 24 are diffused or implanted into one or more layers of semiconductor material (not illustrated). The first conductive lines 20 are used to input the digital codes Din<n> into the digital-to-analog converter system 12. The second conductive lines 22, 23 couple the processing circuit 14 to the digital-to-analog converter system 12. The third conductive line 24 is used to output the processed signal RF to the transmitter 16. In the illustrated example, the digital-to-analog converter system 12 and the processing circuit 14 are also diffused or implanted into the semiconductor material of the chip 18. The integrated devices and elements 12, 14, 20, 22, 23, 24 include transistors, resistors, and other suitable electronic devices some of which are not shown in the drawings for the sake of clarity.

Figure 2:
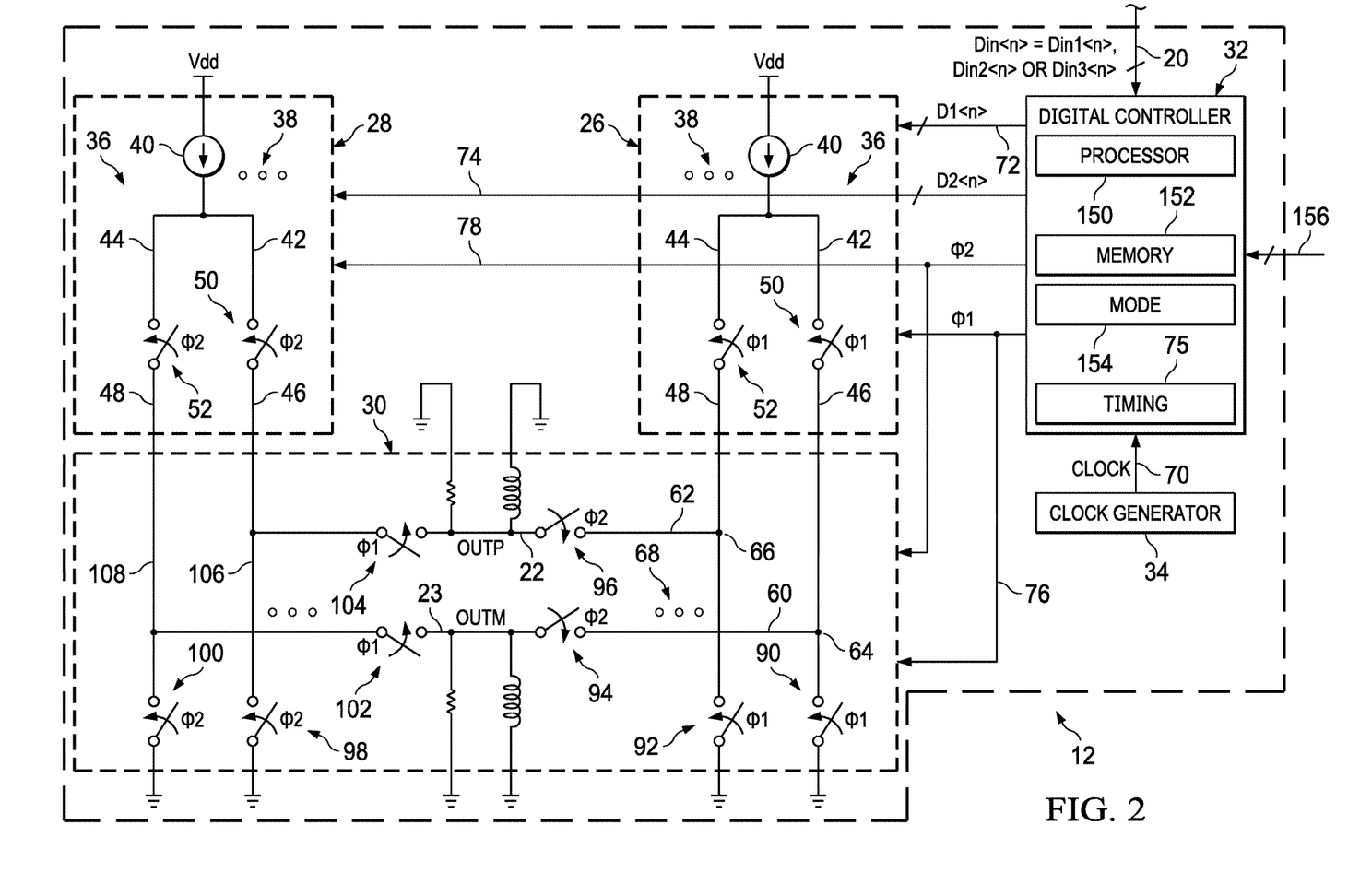
FIG. 2 is a block diagram of a radio-frequency digital-to-analog converter system for the system of FIG. 1.

Referring now to FIG. 2, the digital-to-analog converter system 12 has first and second current-steering digital-to-analog converters 26, 28, a common settling and output circuit 30, a digital controller 32, and a clock generator 34. In the illustrated configuration, the first and second digital-to-analog converters 26, 28 are configured to successively sample and convert first and second sequences of codes D1<n>, D2<n> into first and second analog component signals, respectively, in accordance with first and second timing signals Φ1, Φ2. The component signals are weighted according to the respective sampled codes D1<n>, D2<n>. The settling and output circuit 30 combines the component signals to generate the analog output signals OUTP, OUTM on the second conductive lines 22, 23. The second conductive lines 22, 23 are an example of a common output in accordance with this disclosure. In the illustrated example, the common output 22, 23 is coupled to the first and second digital-to-analog converters 26, 28.

In the illustrated example, the first digital-to-analog converter 26 has a plurality of unit cells 36, 38 arrayed in a five+nine configuration (5-bit thermometer/9-bit binary). A representative one of the unit cells 36 is shown in FIG. 2. The other unit cells 38 of the first digital-to-analog converter 26 are schematically represented by a horizontal ellipsis.

Each unit cell 36, 38 has a current source 40, current lines 42, 44 connected to the current source 40, settling lines 46, 48, and corresponding switches 50, 52 for selectively connecting the current lines 42, 44 to the settling lines 46, 48. The switches 50, 52 are selectively operated as a function of the first codes D1<n> and in accordance with the first timing signal Φ1. The unit cells 36, 38 are identical to each other except that different current sources supply different currents in the binary portion of the converter 26.

The settling and output circuit 30 is coupled to the first and second digital-to-analog converters 26, 28, and the common output 22, 23 is located within the common settling and output circuit 30. In particular, in the illustrated example, the settling lines 46, 48 of the plural unit cells 36, 38 are all connected to discharge lines 60, 62 within the settling and output circuit 30. The electrical connections between (1) the settling lines 46, 48 of the representative unit cell 36 and (2) the discharge lines 60, 62 include nodes 64, 66. The electrical connections between (1) the settling lines 46, 48 of the other unit cells 38 and (2) the discharge lines 60, 62 are schematically represented by a horizontal ellipsis 68.

In the illustrated example, the second digital-to-analog converter 28 is essentially the same as the first digital-to-analog converter 26, except that the switches 50, 52 of the unit cells 36, 38 of the second digital-to-analog converter 28 selectively connect the respective current lines 42, 44 to the respective settling lines 46, 48 as a function of the second codes D2<n> (not the first codes D1<n>), and in accordance with the second timing signal Φ2 (not the first timing signal Φ1).

In operation, the digital controller 32 receives the sequence of incoming codes Din<n> on the first conductive lines 20, and receives a clock signal from the clock generator 34 on a clock signal input line 70. The digital controller 32 generates the first and second codes D1<n>, D2<n> based on the incoming codes Din<n>, under the control of the clock signal, as described in more detail below. The first and second codes D1<n>, D2<n> are communicated to the respective digital-to-analog converters 26, 28 on first and second data lines 72, 74. The first and second timing signals Φ1, Φ2 are also generated by the digital controller 32. The controller 32 uses a timing system 75 to derive the timing signals Φ1, Φ2 from the clock signal. The digital controller 32 is coupled to the first and second digital-to-analog converters 26, 28. The first and second timing signals Φ1, Φ2 are communicated to the respective digital-to-analog converters 26, 28 and to the common settling and output circuit 30 on respective first and second timing lines 76, 78.

Figure 3:
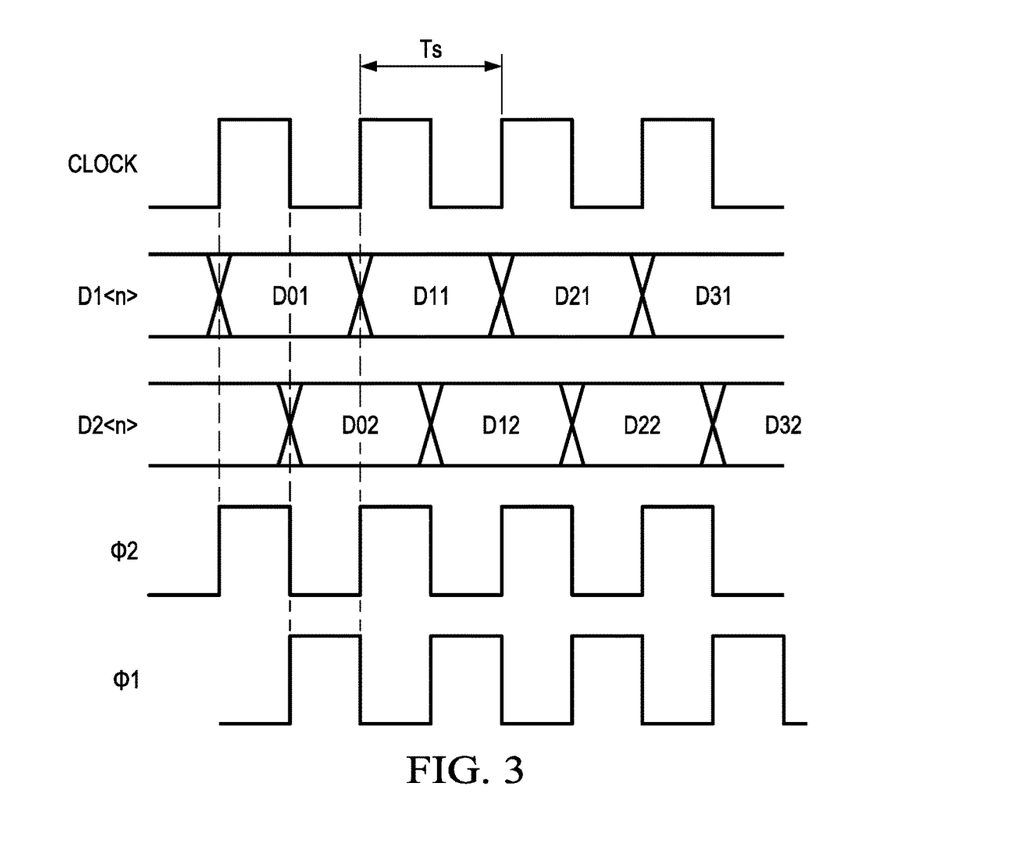
FIG. 3 is a timing chart for the digital-to-analog converter system of FIG. 2.

Referring now to FIG. 3, the digital controller 32, employing the timing system 75, causes the first timing signal Φ1 to be the inverse of the clock signal, and causes the second timing signal Φ2 to be the same as the clock signal. The frequencies of the first and second timing signals Φ1, Φ2 are both the same as the clock-signal frequency, which is the sampling frequency fs for each of the digital-to-analog converters 26, 28 (fs=1/Ts). In other words, the first and second digital-to-analog converters 26, 28 operate at full digital rate, that is, with the same sampling frequency fs and aligned with the clock signal. The digital controller 32 transmits the first and second codes D1<n>, D2<n> to the first and second digital-to-analog converters 26, 28, respectively, at the digital rate, and the digital-to-analog converters 26, 28 are operated at the digital rate (that is, at the same frequency as that of the clock signal which is used to generate the first and second codes D1<n>, D2<n>).

The digital-to-analog converters 26, 28 are not operated, for example, at one-half of the clock-signal frequency; instead, the switches 50, 52 are selectively closed and opened at the full digital rate. As a result, interleaving error that might otherwise occur in the digital-to-analog converter system 12 can be avoided. Each one of the digital-to-analog converters 26, 28 (FIG. 2) samples digital data (from the respective data lines 72, 74) and outputs corresponding analog component signals (on the respective settling lines 46, 48) one time (and only one time) for each cycle of the clock signal.

Moreover, both digital-to-analog converters 26, 28 are operated by the timing system 75 of the digital controller 32 in a return-to-zero (RZ) configuration. When the first digital-to-analog converter 26 is connected to the output lines 22, 23 (such that an analog component signal from the first converter 26 is transmitted to the output lines 22, 23), the second digital-to-analog converter 28 is reset, and vice versa. The first digital-to-analog converter 26 outputs analog component signals through at least some of the output switches 50, 52 for only one-half of a clock cycle (only for a period of Ts/2), and outputs no signal through the switches 50, 52 for the other half of the same clock cycle. Likewise, analog component signals are output through at least some of the output switches 50, 52 of the second digital-to-analog converter 28 for only one-half of a clock cycle, and no signal is output through the switches 50, 52 of the second digital-to-analog converter 28 for the other half of the respective clock cycle.

As illustrated in FIG. 3, when the clock signal is low, the first and second timing signals Φ1, Φ2 are high and low, respectively. As a result, when the clock signal is low, some of the switches 50, 52 of the first digital-to-analog converter 26 are closed, according to the code D1 then applied to the first digital-to-analog converter 26, all first common switches 90, 92 located in the common circuit 30 are closed (thereby connecting the first digital-to-analog converter 26 to ground), first output switches 94, 96 in the common circuit 30 are open, all of the switches 50, 52 of the second digital-to-analog converter 28 are open, all second common switches 98, 100 located in the common circuit 30 are open, and second output switches 102, 104 in the common circuit 30 are closed.

Thus, when the clock signal is low, analog component signals that have settled on the settling lines 46, 48 of the unit cells 36, 38 of the second digital-to analog converter 28 are discharged through discharge lines 106, 108, through the closed second output switches 102, 104, onto the second conductive lines 22, 23, and from there to the processing circuit 14 (FIG. 1). At the same time, when the clock signal is low, no analog component signals are discharged through the first output switches 94, 96 (FIG. 2), but analog component signals settle on the settling lines 46, 48 of the first digital-to-analog converter 26. The combined magnitude of the signals that settle on the settling lines 46, 48 of the first digital-to-analog converter 26 is determined by the first code D1 then sampled by the first digital-to-analog converter 26.

Subsequently, when the clock signal is high, the first and second timing signals Φ1, Φ2 are low and high, respectively. As a result, some of the switches 50, 52 of the second digital-to-analog converter 28 are closed, according to the code D2 then sampled by the second digital-to-analog converter 28, all of the second common switches 98, 100 are closed (thereby connecting the second digital-to-analog converter 28 to ground), the second output switches 102, 104 in the common circuit 30 are open, all of the switches 50, 52 of the first digital-to-analog converter 26 are open, all of the first common switches 90, 92 are open, and the first output switches 94, 96 are closed.

Thus, when the clock signal is high, analog component signals that have settled on the settling lines 46, 48 of the unit cells 36, 38 of the first digital-to-analog converter 26 are discharged through the discharge lines 60, 62, through the first output switches 94, 96, onto the second conductive lines 22, 23, and from there to the processing circuit 14 (FIG. 1). At the same time, when the clock signal is high, no analog component signals are discharged through the second output switches 102, 104 (FIG. 2), but analog component signals settle on the settling lines 46, 48 of the second digital-to-analog converter 28. The combined magnitude of the signals that settle on the settling lines 46, 48 of the second digital-to-analog converter 28 is determined by the second code D2 then sampled by the second digital-to-analog converter 28.

Figure 4:
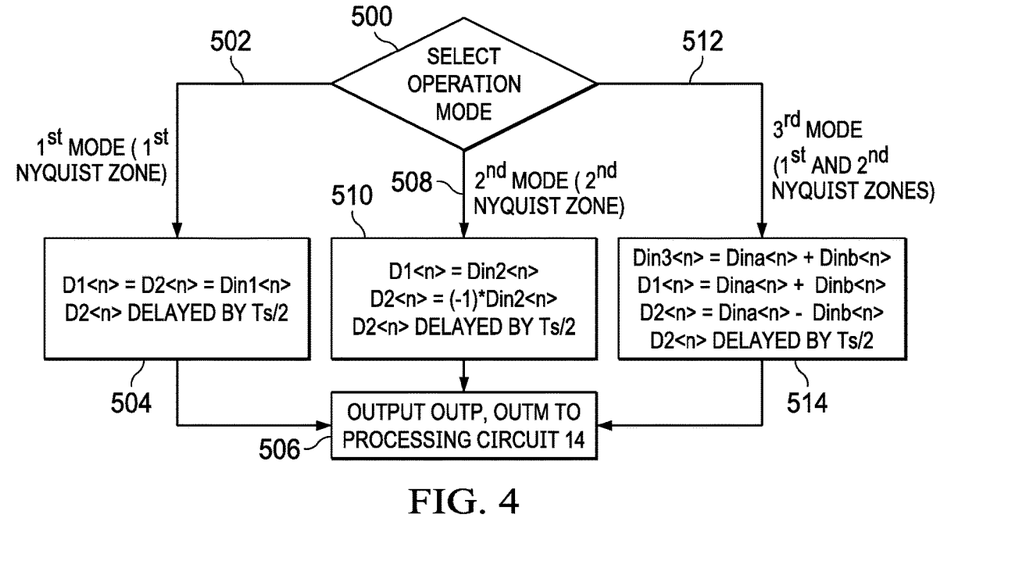
FIG. 4 is a flow chart for a method of operating the radio-frequency system of FIG. 1.

In the illustrated example, the digital controller 32 has a suitable processor 150, a suitable memory 152, and a suitable mode-selection circuit 154. The selection circuit 154 is operated in accordance with digital instruction signals on suitable lines 156. As explained in more detail below, the selection circuit 154 selects one of first, second, and third modes, which are different from each other, based on the instruction signals on lines 156. The selection step 500 is illustrated in FIG. 4. If the first mode is selected, the process illustrated in FIG. 4 proceeds (502) to a first-mode data-processing step 504, and from there to an output processing step 506. If the second or third mode is selected by the mode-selection circuit 154, then the process proceeds (508, 512) to a second or third-mode data-processing step 510, 514, respectively, and from there to the output processing step 506, as described in more detail below.

The digital-to-analog converter system 12 (FIG. 2) may be operated in the first mode when a frequency band fin1 (f1≤fin1≤f2) that is desired to be represented in the radio-frequency signal RF (FIG. 1) is in the first Nyquist zone (that is, when fin1<fs/2). When the digital-to-analog system 12 is operated in the first mode, the codes D1<n>, D2<n> that are supplied to the first and second digital-to-analog converters 26, 28 are both the same as the incoming codes Din1<n> on lines 20 (that is, D1<n>=D2<n>=Din1<n>), but the second codes D2<n> are delayed relative to the first codes D1<n> by one-half of a clock cycle. Step 504 (FIG. 4) includes generating the first and second codes D1<n>, D2<n> based on the incoming codes Din1<n> in the first mode.

As illustrated in FIG. 3, the first codes D1<n> are D01, D11, D21, D31 . . . Dn1, and the second codes D2<n> are D02, D12, D22, D32 . . . Dn2. When the digital-to-analog converter system 12 is operated in the first mode, and when the incoming codes Din1<n> are D0, D1, D2, D3 . . . Dn, then the digital controller 32 causes the first codes D1<n> to be equal to the incoming codes Din1<n>, such that D01=D0, D11=D1, D21=D2, D31=D3 . . . Dn1=Dn, and the digital controller 32 causes the second codes D2<n> to also be equal to the incoming codes Din1<n>, such that D02=D0, D12=D1, D22=D2, D32=D3 . . . Dn2=Dn. In the first mode, the digital controller 32, employing the timing system 75, causes each one of the second codes D2<n> to be submitted to the second digital-to-analog converter 28 for sampling after the corresponding one of the first codes D1<n> is submitted to the first digital-to-analog converter system 26 for sampling, by a relative delay that is equal to Ts/2.

Figure 5:
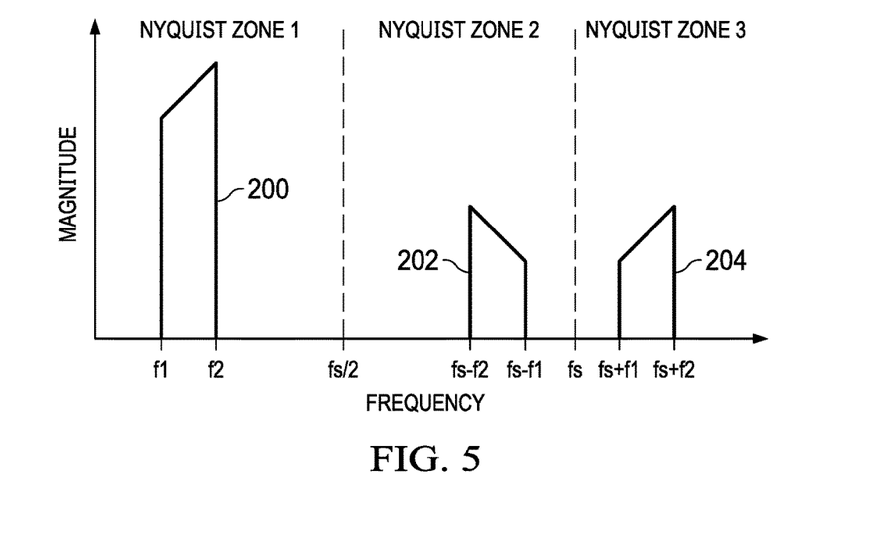
FIG. 5 is a frequency-response graph, showing the magnitude of an output signal as a function of input-signal frequency and sampling frequency, for the digital-to-analog converter system of FIG. 2.

When the digital-to-analog converter system 12 is operated in the first mode, both digital-to-analog converters 26, 28 are operated at full digital rate so there is little or no interleaving error, and the frequency response of the system 12 may be as illustrated in FIG. 5, as follows: A relatively strong signal 200 may be produced in the first Nyquist zone (from f1 through f2). A corresponding but weaker signal 202 may be produced in the second Nyquist zone [from (fs−f2) through (fs−f1)]. Another corresponding but weak signal 204 may be produced in the third Nyquist zone [from (fs+f1) through (fs+f2)].

The magnitudes of the frequency responses 200, 202, 204 are determined according to a sin(x)/x function, where the characteristic sinc droop produces the difference in magnitude between the relatively strong signal 200 in the first Nyquist zone and the relatively weaker signal 202 in the second Nyquist zone. The magnitudes of the weaker signals 202, 204 are small enough so that the weaker signals 202, 204 can be easily filtered out of the resulting analog signals OUTP, OUTM by the processing circuit 14, such that only the analog signal 200 in the first Nyquist zone (from f1 through f2) is transmitted on the third conductive line 24 (FIG. 1) to the transmitter 16. Step 506 (FIG. 4) includes outputting the signals 200, 202, 204 (FIG. 5), as the output signals OUTP, OUTM, to the processing circuit 14.

The digital-to-analog converter system 12 may be operated in the second mode (also referred to herein as a multiplication mode) when a frequency band fin2 [(fs−f2) ≤fin2≤(fs−f1)] that is desired to be represented in the radio-frequency signal RF is in the second Nyquist zone (that is, when fs/2<fin2<fs). When the digital-to-analog system 12 is operated in the second mode, the codes D1<n> that are supplied to the first digital-to-analog converter 26 are the same as the incoming codes Din2<n>(D1<n>=Din2<n>), but the second codes D2<n> are the inverse of the incoming codes (D2<n>=(−1)*Din2<n>) and are delayed relative to the first codes D1<n> by one-half of the clock cycle. Step 510 (FIG. 4) includes generating the first and second codes D1<n>, D2<n> based on the incoming codes Din2<n> in the second mode.

When the digital-to-analog converter system 12 is operated in the second mode, and when the incoming codes Din2<n> are D0, D1, D2, D3 . . . Dn, the digital controller 32 causes the first codes D1<n> to be equal to the incoming codes Din2<n>, such that D01=D0, D11=D1, D21=D2, D31=D3 . . . Dn1=Dn, and the digital controller 32 causes the second codes D2<n> to be the inverse of the input codes Din2<n>, such that D02=−D0, D12=−D1, D22=−D2, D32=−D3 . . . Dn2=−Dn. In the second mode, as in the first mode, the digital controller 32, employing the timing system 75, causes each one of the second codes D2<n> to be submitted to the second digital-to-analog converter 28 for sampling after the corresponding one of the first codes D1<n> is submitted to the first digital-to-analog converter 26 for sampling, by a delay that is equal to Ts/2.

In the second mode of operation, both digital-to-analog converters 26, 28 are operated at full digital rate so there is little or no interleaving error. The magnitudes [Mag(f)] of the analog signals generated on the second conductive lines 22, 23, shown in FIG. 6, are a function of the input frequency fin and the sampling period Ts (Ts=1/fs), as follows:

$$\text{Mag}(f) = \{\sin\,[\pi*\text{fin}*(Ts/2)]\}^{2/[\pi*\text{fin}*(Ts/2)]}$$

Figure 6:
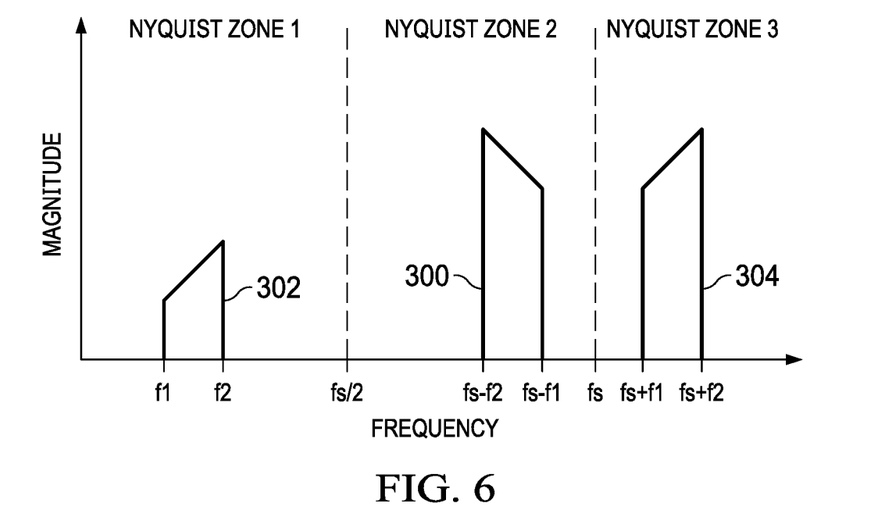
FIG. 6 is another frequency-response graph for the digital-to-analog converter system of FIG. 2.

As illustrated in FIG. 6, when the digital-to-analog converter system 12 is operated in the second mode, a relatively strong signal 300 may be produced in the second Nyquist zone [from (fs−f2) through (fs−f1)]. A corresponding but weaker signal 302 may be produced in the first Nyquist zone (from f1 through f2), and another corresponding signal 304 may be produced in the third Nyquist zone [from (fs+f1) through (fs+f2)]. The magnitude of the signal 302 in the first Nyquist zone may be small enough so that the first Nyquist zone signal 302 can be easily filtered out of the resulting signals OUTP, OUTM by the processing circuit 14. The signal 304 in the third Nyquist zone may be far enough away (frequency-wise) from the signal 300 in the second Nyquist zone to be filtered out of the resulting signals OUTP, OUTM, if desired, by the processing circuit 14. As a result, if desired, the transmission system 10 (FIG. 1) may transmit only the analog signal 300 to the transmitter 16.

The digital-to-analog converter system 12 may be operated in the third mode (also referred to herein as a mixed mode) when there are two frequency bands fin11, fin22 [f3≤fin11<f4; (fs−f2)≤fin22≤(fs−f1)] that are desired to be represented in the radio-frequency signal RF, and the two frequency bands fin11, fin22 are in the first and second Nyquist zones, respectively. When the digital-to-analog system 12 is operated in the third mode, first and second sequences of input codes Dina<n>, Dinb<n> are derived, by the digital controller 32, from the incoming codes Din3<n>. The first input codes Dina<n> contain data for the signal that is desired to be represented in the first Nyquist zone, and the second input codes Dinb<n> contain data for the signal that is desired to be represented in the second Nyquist zone.

When the digital-to-analog converter system 12 is operated in the third mode, the first and second input codes Dina<n>, Dinb<n> are combined by the digital controller 32 to form the first codes D1<n>, which are supplied to the first digital-to-analog converter 26, and the digital controller 32 subtracts the second input codes Dinb<n> from the first input codes Dina<n> to form the second codes D2<n>, which are supplied to the second digital-to-analog converter 28. Step 514 (FIG. 4) includes generating the first and second codes D1<n>, D2<n> based on the incoming codes Din3<n> in the third mode.

In other words, when the first and second input codes Dina<n>, Dinb<n> are D0a, D1a, D2a, D3a . . . Dna and D0b, D1b, D2b, D3b . . . Dnb, respectively, and when the digital-to-analog converter system 12 is operated in the third mode, the digital controller 32 causes the first codes D1<n> to be D01=D0a+D0b, D11=D1a+D1b, D21=D2a+D2b, D31=D3a+D3b . . . Dn1=Dna+Dnb. The first codes D1<n> are equal to the sum of the first and second components D1a<n>, D1b<n> of the incoming codes Din3<n>, and the digital controller 32 causes the second codes D2<n> to be D02=D0a−D0b, D12=D1a−D1b, D22=D2a−D2b, D32=D3a−D3b . . . Dn2=Dna−Dnb. In the third mode, the first codes D1<n> are supplied to the first digital-to-analog converter 26, and the second codes D2<n> are supplied to the second digital-to-analog converter 28 but delayed by one-half of the sampling period Ts.

Figure 7:
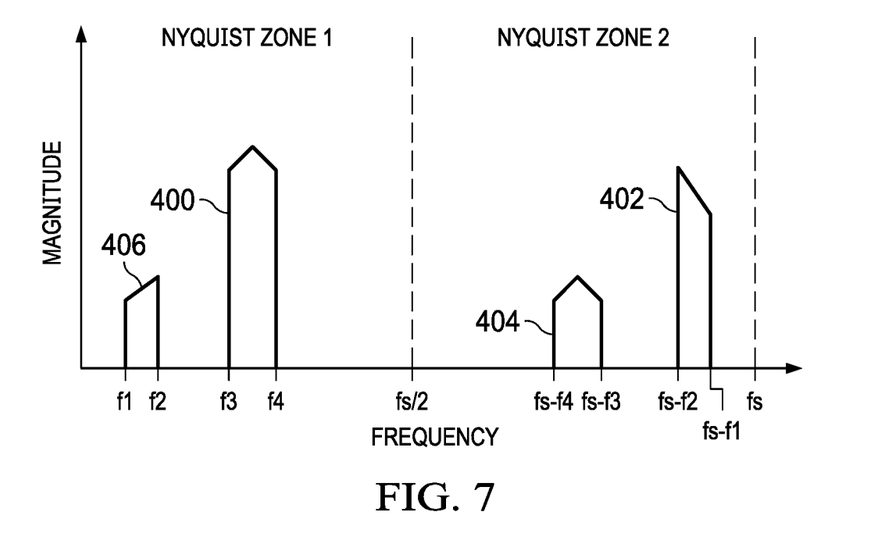
FIG. 7 is another frequency-response graph for the digital-to-analog converter system of FIG. 2.

When the digital-to-analog converter system 12 is operated in the third mode, both digital-to-analog converters 26, 28 are operated at full digital rate so there is little or no interleaving error, and the frequency response of the system 12 may be as illustrated in FIG. 7, as follows: Relatively strong signals 400, 402 may be simultaneously produced in the first and second Nyquist zones [where fin11 is from f3 through f4, and fin22 is from (fs−f2) through (fs−f1)]. Corresponding but weaker signals 404, 406 may be produced in the second and first Nyquist zones [from (fs−f4) through (fs−f3), and from f1 through f2]. The magnitudes of the weaker signals 404, 406 may be small enough that the weaker signals 404, 406 can be easily filtered out of the resulting signal OUTP, OUTM by the processing circuit 14, such that only the desired analog signals 400, 402, in the first and second Nyquist zones, are transmitted on the third conductive line 24 to the transmitter 16.

If desired, a third signal (not illustrated in FIG. 7) may be produced in the third Nyquist zone and not removed from the output signals OUTP, OUTM. The digital-to-analog converter system 12 may be configured, if desired, to represent output simultaneously in the first, second, and/or third Nyquist zones while preserving the good spurious free dynamic range (SFDR) that is typically inherent in return-to-zero digital-to-analog conversion. At the same time, the digital-to-analog converter system 12 may provide the same output power as an otherwise corresponding non-return-to-zero (NRZ) digital-to-analog converter system, because the digital-to-analog converter system 12, in operation, always contributes to the output signals OUTP, OUTM. As noted above, when the first converter 26 is connected to the output lines 22, 23, the second converter 28 is reset, and vice versa.

The digital controller 32 may be selectively configured by a suitable software module, within the mode-selection circuit 154, to switch to, and operate in, a desired one of the first, second, and third modes. In another example, a mode-selection circuit within a digital controller may have suitable hardware that is driven by codes on input lines to cause a digital-to-analog converter system to switch to, and operate in, a desired one of the first, second, and third modes.

The digital-to-analog converter system 12 illustrated in FIG. 2 may, if desired, be operated as a wide-band radio-frequency digital-to-analog converter system, with satisfactory spurious free dynamic range. If desired, the digital-to-analog converter system 12 may be operated with a spurious free dynamic range of better than 72 dBc. Since both of the digital-to-analog converters 26, 28 operate at full digital rate (at the same rate as the clock signal), at least some of the timing mismatches that might otherwise occur are avoided, and therefore at least some of the spurs that might otherwise appear at fs/2±fin are avoided. Thus, this disclosure provides a high spurious free dynamic range architecture for a radio-frequency digital-to-analog converter system capable of supporting both first and second Nyquist at the same time.

The digital-to-analog converter system 12 may advantageously be configured to support multi-band operation in a relatively uncomplicated manner. If desired, the digital-to-analog converter system 12 may be configured to support multi-band signals with frequencies from direct current (dc) up to 1.25 times the sampling rate (that is, up to 1.25 fs). If desired, the digital-to-analog converter system 12 may be configured to support a sampling frequency fs of up to twelve gigahertz (12 GHz).

However, this disclosure may be implemented in a variety of configurations and is not limited to the details illustrated in the drawings or mentioned herein. For example, this disclosure is not necessarily limited to the use of the illustrated current-steering digital-to-analog converters 26, 28, but may be implemented with a current-steering converter that has a different configuration of unit cells, a capacitor array-type digital-to-analog converter, a resistor ladder-type digital-to-analog converter, or another suitable digital-to-analog converter.

What have been described above are examples. This disclosure is intended to embrace alterations, modifications, and variations to the subject matter described herein that fall within the scope of this application, including the appended claims. As used herein, the term "includes" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed as new and desired to be protected by Letters Patent of the United States is:

1. A system, comprising:
   a first digital-to-analog converter;
   a second digital-to-analog converter;
   a digital controller coupled to the first and second digital-to-analog converters for receiving incoming codes, and for generating first and second codes based on the incoming codes, the second codes being delayed relative to the first codes; and
   a common output coupled to the first and second digital-to-analog converters; and
   wherein the digital controller includes a timing system for operating the first and second digital-to-analog converters based on the first and second codes, respectively, at a radio frequency digital rate, wherein the digital controller is configured in a first mode to cause the first and second digital-to-analog converters to generate analog signals from the incoming codes using a function, and then in a second mode to generate the analog signals from the incoming codes using a different function;
   wherein each one of the digital-to-analog converters includes current sources and switches for connecting the current sources to ground, and wherein the digital controller causes the switches of the first digital-to-analog converter to be open while the signal from the first digital-to-analog converter is transmitted to the common output.

2. The system of claim 1, further comprising a common settling and output circuit coupled to the first and second digital-to-analog converters, and wherein the common output is located in the common settling and output circuit.

3. The system of claim 2, wherein the common settling and output circuit includes first and second switches for transmitting the signals from the first and second digital-to-analog converters to the common output.

4. The system of claim 3, wherein the digital controller causes the first switch of the common settling and output circuit to be closed, to transmit the signal from the first digital-to-analog converter to the common output, while the second switch of the common settling and output circuit is open, and causes the second switch of the common settling and output circuit to be closed, to transmit the signal from the second digital-to-analog converter to the common output, while the first switch of the common settling and output circuit is open.

5. A system, comprising:
   a first digital-to-analog converter;
   a second digital-to-analog converter;
   a digital controller coupled to the first and second digital-to-analog converters for receiving incoming codes, and for generating first and second codes based on the incoming codes, the second codes being delayed relative to the first codes; and
   a common output coupled to the first and second digital-to-analog converters; and
   wherein the digital controller includes a timing system for operating the first and second digital-to-analog converters based on the first and second codes, respectively, at a radio frequency digital rate, wherein the digital controller is configured in a first mode to cause the first and second digital-to-analog converters to generate analog signals from the incoming codes using a function, and then in a second mode to generate the analog signals from the incoming codes using a different function;
   wherein the digital controller is configured to operate the first and second digital-to-analog controllers (DACs) in the first mode in which the digital controller generates the first codes to be equal to the sum of a first component of the incoming codes and a second component of the incoming codes, and generates the second codes to be equal to the second component of the incoming codes subtracted from the first component of the incoming codes to cause the first and second DACs to generate a radio-frequency analog signal having relatively strong signals in first and second Nyquist zones simultaneously; and
   wherein the digital controller is configured to operate the first and second DACs in the second mode in which the digital controller generates the first codes to be equal to the incoming codes, and generates the second codes to be equal to the incoming codes to cause the first and second DACs to generate a radio-frequency analog signal having a relatively strong signal in the first Nyquist zone.

6. The system of claim 1, wherein the digital controller is configured to operate the first and second digital-to analog controllers (DACs) in the first mode in which the digital controller generates the first codes to be equal to the sum of a first component of the incoming codes and a second component of the incoming codes, and generates the second codes to be equal to the second component of the incoming codes subtracted from the first component of the incoming codes to cause the first and second DACs to generate a radio-frequency analog signal having relatively strong signals in first and second Nyquist zones simultaneously; and
   wherein the digital controller is configured to operate the first and second DACs in the second mode in which the digital controller generates the first codes to be equal to the incoming codes, and generates the second codes to be equal to the inverse of the incoming codes to cause the first and second DACs to generate a radio-frequency analog signal having a relatively strong signal in the second Nyquist zone and another relatively strong signal in a third Nyquist zone.

7. The system of claim 1, wherein the digital controller is configured to operate the first and second digital-to analog controllers (DACs) in the first mode in which the digital controller generates the first codes to be equal to the sum of a first component of the incoming codes and a second component of the incoming codes, and generates the second codes to be equal to the second component of the incoming codes subtracted from the first component of the incoming codes to cause the first and second DACs to generate a radio-frequency analog signal having relatively strong signals in first and second Nyquist zones simultaneously;
   wherein the digital controller is configured to operate the first and second DACs in the second mode in which the digital controller generates the first codes to be equal to the incoming codes, and generates the second codes to be equal to the inverse of the incoming codes to cause the first and second DACs to generate a radio-frequency analog signal having a relatively strong signal in the second Nyquist zone and another relatively strong signal in a third Nyquist zone; and
   wherein the digital controller is configured to operate the first and second DACs in a third mode in which the digital controller generates the first codes to be equal to the incoming codes, and generates the second codes to be equal to the incoming codes to cause the first and second DACs to generate a radio-frequency analog signal having a relatively strong signal in the first Nyquist zone.

* * * * *